United States Patent [19]

Takechi et al.

[11] Patent Number: 4,857,848

[45] Date of Patent: Aug. 15, 1989

[54] NUCLEAR MAGNETIC RESONANCE IMAGING APPARATUS

[75] Inventors: Moriaki Takechi; Yuji Simada, both of Ako, Japan

[73] Assignee: Mitsubishi Denki Kabushiki Kaisha, Tokyo, Japan

[21] Appl. No.: 169,273

[22] Filed: Mar. 17, 1988

[30] Foreign Application Priority Data

Mar. 18, 1987 [JP] Japan ..................... 62-64851

[51] Int. Cl.$^4$ ............................................. G01R 33/20
[52] U.S. Cl. ..................................... 324/318; 324/319
[58] Field of Search ............... 324/300, 307, 309, 318, 324/315, 319, 320, 322

[56] References Cited

U.S. PATENT DOCUMENTS

| 4,213,092 | 7/1980 | Kneip ........................... 324/319 |
| 4,612,505 | 9/1986 | Zijlstra ......................... 324/300 |
| 4,751,464 | 6/1988 | Bridges ........................ 324/322 |

FOREIGN PATENT DOCUMENTS 60-94705  5/1985  Japan .

Primary Examiner—Michael J. Tokar
Attorney, Agent, or Firm—Oblon, Spivak, McClelland, Maier & Neustadt

[57] ABSTRACT

A nuclear magnetic resonance imaging apparatus has a superconducting coil which generates a static magnetic field, an electrically-conducting tubular heat shield which surrounds the superconducting coil, and a pair of confronting circular coils which are coaxial with the longitudinal axis of the cylindrical thermal shield and generate a gradient field in the longitudinal direction of the heat shield. The magnetic field generated by the circular coils induces eddy currents in the heat shield, and the eddy currents generate magnetic fields which form a composite magnetic field together with the magnetic field generated by the circular coils. The circular coils are positioned such that the terms in the expression for the magnetic flux density of the composite magnetic field which are proportional to the cube of the distance in the longitudinal direction of thermal shield cancel one another.

2 Claims, 2 Drawing Sheets

NUCLEAR MAGNETIC RESONANCE IMAGING APPARATUS

BACKGROUND OF THE INVENTION

This invention relates to a nuclear magnetic resonance imaging apparatus.

FIG. 1 is a cut-away perspective view of a conventional nuclear magnetic resonance imaging apparatus of the type to which the present invention pertains. As shown in this figure, superconducting coils 1 which generate a high-uniformity static magnetic field are surrounded by cylindrical thermal shield 2 which shields the superconducting coils 1 from heat transfer. The thermal shield 2 is made of a metal of good electrical conductivity such as copper or aluminum. The superconducting coils 1 and the thermal shield 2 together constitute a superconducting magnet and are disposed inside a cylindrical housing 3. The inner periphery of the housing 3 surrounds a cylindrical frame 6 on which a plurality of magnetic field coils 4a, 4b, 5a, and 5b are wound. Magnetic field coil 4a generates a gradient field in the direction of the X axis in FIG. 1, and magnetic field coil 4b generates a gradient field in the direction of the Y axis. Magnetic field coils 5a and 5b are in the form of coaxial rings and will hereinafter be referred to as circular coils. The circular coils 5a and 5b generate a gradient field in the direction of the Z axis when current is passed through the coils in opposite directions. A human patient 7 who is used as a subject for imaging lies inside the apparatus upon a movable bed 8 by means of which his position can be adjusted.

In a nuclear magnetic resonance imaging apparatus of this type, imaging control of the nuclear magnetic resonance which is induced in the patient 7 is performed using the high-uniformity static magnetic field which is generated by the superconducting coils 1 and the gradient field which are generated in the X, Y, and Z directions, respectively, by the magnetic field coils 4a, 4b, and 5a and 5b. It is important that the magnetic flux density of the magnetic field in the direction of the Z axis should vary as linearly as possible along the Z axis. For this reason, the circular coils 5a and 5b are positioned in accordance with the following principles, which will be explained while referring to FIG. 2, which is a schematic perspective view of the circular coils 5a and 5b of FIG. 1. The origin O of the coordinate axes in the figure lie midway between the two circular coils 5a and 5b, and the Z axis coincides with a line connecting their centers. If the radius of both circular coils 5a and 5b is $a_1$ and the Z coordinates of the centers of the coils are $+Z_1$ and $-Z_1$, respectively, the magnetic flux density B(Z) of the magnetic field at an arbitrary point Z along the Z axis when a current I is passed through the coils 5a and 5b in opposite directions is given by the following equation:

$$B(Z) = (\mu_0 I/a_1)\epsilon_1(\beta)(Z/a_1) + \epsilon_3(\beta)(Z/a_1)^3 + \epsilon_5(\beta)(Z/a_1)^5 + \text{higher order terms} \quad (1)$$

Where, $\mu_0$ is the permeability of vacuum and $\epsilon_1(\beta)$, $\epsilon_3(\beta)$, and $\epsilon_5(\beta)$ are functions of the ratio $\beta = Z/a_1$, i.e., the ratio between the distance $Z_1$ of the centers of the circular coils from the origin O and the coil radius $a_1$. In order for the magnetic flux density B(Z) which is given by Equation (1) to be linearly proportional to Z, it is necessary only to eliminate the term proportional to $Z^3$ and all higher order terms. The value of the function $\epsilon_3(\beta)$ is given by the following equation.

$$\epsilon_3(\beta) = -\frac{5}{2} \cdot \frac{\beta(3-4\beta^2)}{(1+\beta^2)^{9/2}} \quad (2)$$

Accordingly, if $\beta$ is chosen to be $\pm\sqrt{3}/2$, then $\epsilon_3(\beta)=0$, and the Z cubed term in Equation (1) is eliminated. Furthermore, when $Z/a_1 < 1$, the term proportional to $(Z/a_1)^5$ is small compared to the term proportional to Z and are negligible. Therefore, B is set equal to $\pm\sqrt{3}/2$. In other words, $Z_1 = \pm\sqrt{3}a_1/2$, and in the coil system of FIG. 2, in the region of interest near the origin O, a magnetic field can be generated whose magnetic flux density is linearly proportional to the Z coordinate.

However, in a conventional nuclear magnetic resonance imaging apparatus having the above-described geometry, a magnetic flux density of high linearity can be obtained only under ideal conditions in which there are no fluctuations due to surrounding magnetic fields. Under actual conditions, as the thermal shield 2 is a metal of good electrical conductivity, when pulse currents which are necessary for nuclear magnetic resonance imaging flow through the circular coils 5a and 5b, eddy currents are induced in the thermal shield 2 due to the magnetic field which is generated by the circular coils 5a and 5b. The resulting magnetic field along the Z axis is therefore a composite magnetic field, i.e., a combination of the magnetic fields due to the eddy currents and the magnetic field generated by the circular coils 5a and 5b. Because of the component due to the magnetic fields generated by the eddy currents, the composite magnetic field does not vary linearly along the Z axis.

SUMMARY OF THE INVENTION

It is therefore an object of the present invention to provide a nuclear magnetic resonance imaging apparatus which can compensate for the effects of eddy currents in a thermal shield and produce a magnetic field whose flux density varies in a highly linear manner in the longitudinal direction of the apparatus.

A nuclear magnetic resonance imaging apparatus in accordance with the present invention has superconducting coils which generate a static magnetic field, an electrically-conducting cylindrical thermal shield which surrounds the superconducting coil, and a pair of confronting circular coils which are coaxial with the longitudinal axis of the cylindrical thermal shield and generate a linearly-varying magnetic field in the longitudinal direction of the thermal shield. The magnetic fields generated by the circular coils induce eddy currents in the thermal shield. The magnetic fields generated by the eddy currents and the magnetic field generated by the circular coils together form a composite magnetic field. The distance between the centers of the circular coils is selected such that that the terms which are proportional to the cube of distance in the longitudinal direction of the thermal shield in the expression for the magnetic flux density of the composite magnetic field cancel one another. As 5th order and higher order terms in the expression for the magnetic flux density are negligible, the expression for the magnetic flux density becomes a linear expression, and a composite magnetic field whose flux density varies substantially linearly is obtained.

BRIEF DESCRIPTION OF THE DRAWINGS

In the figures, the same reference numerals indicate the same or corresponding parts.

DESCRIPTION OF THE PREFERRED EMBODIMENT

Figure 1:
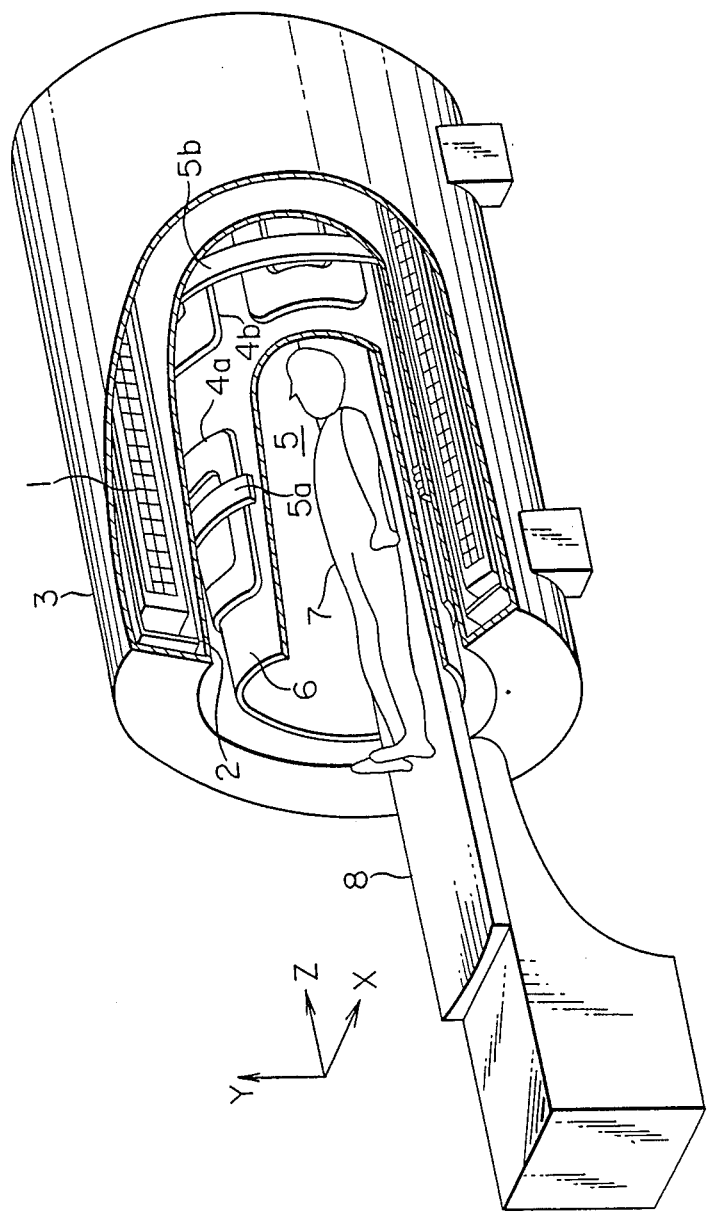
FIG. 1 is a perspective view of a conventional nuclear magnetic resonance imaging apparatus of the type to which the present invention pertains.
Figure 2:
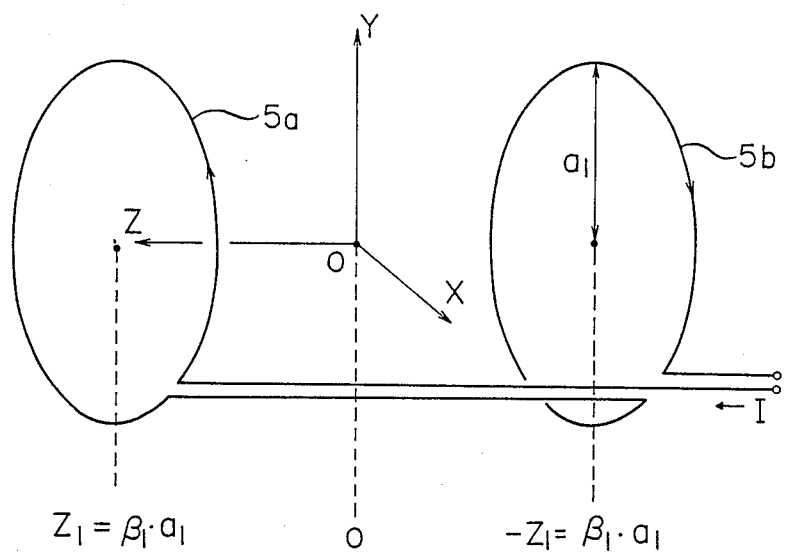
FIG. 2 is a schematic perspective view illustrating the geometric relationship between the circular coils of FIG. 1.
Figure 3:
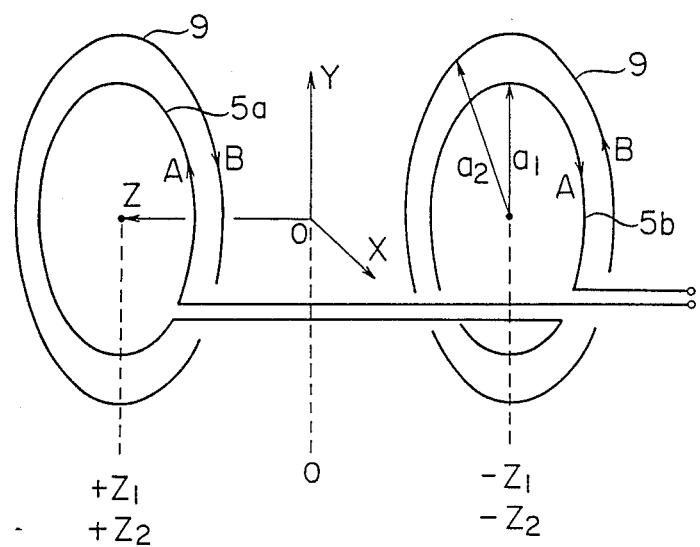
FIG. 3 is a schematic perspective view illustrating the geometric relationship between the circular coils of an embodiment of the present invention.

Hereinbelow, a preferred embodiment of the present invention will be described while referring to the accompanying drawings. The overall structure of this embodiment is similar to that of the conventional apparatus which is illustrated in FIG. 1, the sole difference being in the disposition of the circular coils $5a$ and $5b$ of this embodiment. FIG. 3 is a schematic view illustrating the geometric relationship between the two circular coils $5a$ and $5b$. The coils both have the same radius $a_1$, and the Z coordinates of the centers of the coils are respectively $+Z_1$ and $-Z_1$. The two coils are electrically connected with an unillustrated power supply so that currents flow therethrough in opposite directions, as indicated by the arrows marked A. The assumed flow paths of the eddy currents which are induced in the thermal shield 2 when a pulse current flows through the circular coils $5a$ and $5b$ are indicated by reference numerals 9. The directions of the eddy currents are indicated by the arrows marked B. The radius of each flow path 9 is equal to the radius $a_2$ of the thermal shield 2, and the Z coordinates $\pm Z_2$ of the centers of the flow paths 9 are approximately equal to the Z coordinates $\pm Z_1$ of the centers of the circular coils $5a$ and $5b$. The magnetic flux density of the composite magnetic field formed by the circular coils $5a$ and $5b$ and the eddy currents is given by the following equation.

$$B(Z) = (\mu_0 I_1/a_1)\{\epsilon_1(\beta_1)(Z/a_1) + \epsilon_3(\beta_1)(Z/a_1)^3 + \text{higher order terms}\} - (\mu_0 I_2)/a_2)\{\epsilon_1(\beta_2)Z/a_2) + \epsilon_3(\beta_2)(Z/a_2)^3 + \text{higher order terms}\} \quad (3)$$

wherein $\beta_1 = Z_1/a_1$, $\beta_2 = Z_2/a_2$, $I_1$ is the current flowing through the circular coils $5a$ and $5b$, and $I_2$ is the value of the eddy currents. Therefore, if the Z coordinates $\pm Z_1$ of the centers of the circular coils $5a$ and $5b$ are chosen so as to satisfy the following equation, the third order term of Equation (3) is eliminated.

$$(I_1/a_1^4)\epsilon_3(\beta_1) - (I_2/a_2^4)\epsilon_3(\beta_2) = 0 \quad (4)$$

As is clear from Equation (2), if $0 < \epsilon < \sqrt{3/2}$, then the function $\epsilon_3(\beta)$ is negative, and if $\beta > \sqrt{3/2}$, it is positive. Therefore, in order to satisfy Equation (4), the value of $\beta$ is chosen to be $0 < \beta < \sqrt{3/2}$. Accordingly, by choosing the Z coordinates of the centers of the circular coils $5a$ and $5b$ to have an absolute value smaller than $\sqrt{3/2}$, for which equation (2) is equal to 0, i.e., by setting the distance between the circular coils $5a$ and $5b$ to be less than $\sqrt{3}$ times the radius of each of the circular coils $5a$ and $5b$, the magnetic field which is produced by the eddy currents can be compensated for, and a composite magnetic field of excellent linearity can be obtained.

What is claimed is:

1. A nuclear magnetic resonance imaging apparatus having superconducting coil which generates a static magnetic field, an electrically-conducting cylindrical thermal shield which surrounds said superconducting coil, and a pair of confronting circular coils which are coaxial with the longitudinal axis of said cylindrical thermal shield and generate a gradient field in the longitudinal direction of said thermal shield with the magnetic field generated by said circular coils inducing eddy currents in said thermal shield, said eddy currents generating magnetic fields which form a composite magnetic field together with the magnetic field generated by said circular coils, wherein the magnetic flux density of said composite magnetic field contains two terms which are proportional to the cube of a distance in said longitudinal direction of said thermal shield and wherein said circular coils are positioned so that said proportional terms in said expression for said magnetic flux density of said composite magnetic field cancel one another.

2. A nuclear magnetic resonance imaging apparatus as claimed in claim 1, wherein the distance between said pair of circular coils is smaller than $\sqrt{3}$ times the radii of said circular coils.

* * * * *